United States Patent [19]
Lane et al.

[11] 3,969,707
[45] July 13, 1976

[54] CONTENT-ADDRESSABLE MEMORY CAPABLE OF A HIGH SPEED SEARCH

[75] Inventors: Ralph D. Lane, Wappingers Falls; Richard A. Manning, Poughkeepsie, both of N.Y.

[73] Assignee: International Business Machines Corporation, Armonk, N.Y.

[22] Filed: Mar. 27, 1975

[21] Appl. No.: 562,695

[52] U.S. Cl........................... 340/173 AM; 307/291; 340/173 FF
[51] Int. Cl.² ................... G11C 15/04; G11C 11/40
[58] Field of Search ........................... 307/291, 238; 340/173 AM, 173 FF

[56] References Cited
UNITED STATES PATENTS 3,573,756   4/1971   Hillis et al. ................. 340/173 AM
3,703,709   11/1972  Matsue ....................... 340/173 AM

OTHER PUBLICATIONS

Berger et al., Content Addressable Storage Cell, IBM Technical Disclosure Bulletin, vol. 16, No. 12, 5/74, pp. 3965–3967.

Spampinato et al., Low–Power Associative Function, IBM Technical Disclosure Bulletin, vol. 13, No. 2, 7/70, pp. 300–301.

*Primary Examiner*—Stuart N. Hecker
*Attorney, Agent, or Firm*—Thomas F. Galvin

[57] ABSTRACT

A Content-Addressable Memory Cell featuring a pair of current switches, one at each output of a flip-flop cell to provide for searching the cell at high speed and without disturbing the contents of the cell.

18 Claims, 5 Drawing Figures

| OPERATION | WORD LINE A | SEARCH "0" OR WRITE "0" LINE B | SEARCH "1" OR WRITE "1" LINE C | B/S "0" LINE D | B/S "1" LINE E |
|---|---|---|---|---|---|
| STANDBY | −1.3 V | −1.5 V | −1.5 V | −1.5 V | −1.5 V |
| READ "1" | −3.1 V | −1.5 V | −1.5 V | −2.3 V | −1.5 V |
| READ "0" | −3.1 V | −1.5 V | −1.5 V | −1.5 V | −2.3 V |
| WRITE "1" | −3.1 V | −1.5 V | 0.0 V | −1.5 V | −0.8 V |
| WRITE "0" | −3.1 V | 0.0 V | −1.5 V | −0.8 V | −1.5 V |
| SEARCH "1" | −1.3 V | −1.5 V | 0.0 V | −1.5 V | −0.8 V |
| SEARCH "0" | −1.3 V | 0.0 V | −1.5 V | −0.8 V | −1.5 V |

FIG. 3

| SEARCH CONDITION | LINE G | LINE H | T3 | T4 | T5 | T6 | MATCH LINE F |
|---|---|---|---|---|---|---|---|
| STORED "1", SEARCH "0" | −1.1 V | −0.5 V | OFF | ON | ON | OFF | −0.8 V (MISMATCH) |
| STORED "1", SEARCH "1" | −1.1 V | −0.5 V | ON | OFF | ON | OFF | 0.0 V (MATCH) |
| STORED "0", SEARCH "1" | −0.5 V | −1.1 V | ON | OFF | OFF | ON | −0.8 V (MISMATCH) |
| STORED "0", SEARCH "0" | −0.5 V | −1.1 V | ON | OFF | ON | OFF | 0.0 V (MATCH) |

FIG. 4

CONTENT-ADDRESSABLE MEMORY CAPABLE OF A HIGH SPEED SEARCH

FIELD OF THE INVENTION

This invention relates to a memory cell. More particularly it relates to a cell which is suitable for use in a content-addressable memory.

BACKGROUND OF THE INVENTION

The content-addressable memory (CAM), also termed an associative memory, is a relatively new type of cell for computer architecture which can indicate whether an input word is or is not stored in the memory. Typically, the data is stored at random locations in the memory and is associated with a predetermined number of coded bits which indicate the nature of the data. Data retrieval is accomplished by applying the code to the memory.

CAM type memories also feature data retrieval on a search basis in cases where it is not known what data is stored in the memory. The code is applied in the Search (Interrogate) mode of operation to the memory and the memory responds with a Match or Mismatch answer. This is a powerful technique because the interrogator need not know how much or what kind of data relating to a particular subject is stored in the memory. Thus, the CAM concept is applicable to system control applications, signal processing, data base management, pattern recognition systems, and so forth.

A major problem in designing commercially acceptable CAM systems is the difficulty of achieving high Search speeds at reasonable power levels without disturbing the contents of the cell. In many CAM designs, the cell is very sensitive to input signal variations. Too high a Search signal will disturb the stored data; too low a signal will fail to generate a Match-Mismatch output. In these cases, the magnitude of the signals must be accurately controlled - a restriction that is often unachievable in commercially feasible, cost effective systems. Most prior art systems extract current from the storage cells during the Search mode; and an excess of current must be available both to maintain searching speed as well as to provide adequate margins against noise which would disturb the cell contents. This has resulted in very high power dissipation within the cell during the Search Mode.

SUMMARY OF THE INVENTION

It is, therefore, an object of our invention to improve both the speed of operation as well as the stability of content-addressable memories.

It is a further object of our invention to improve these parameters while confining ourselves to the use of standard, low cost monolithic integrated circuit components.

These and other objects of our invention are achieved by the use of a pair of current switches to sense the contents of a cross-coupled memory cell during the Search mode. This combination yields the fastest Search time of any content-addressable memory cell known to us but without the drawback of instability.

During the Search mode, only voltage differences are sensed at the internal storage nodes, so that virtually no current is drawn from these nodes. This minimizes power dissipation within the storage devices but without the drawback of instability. However, the current level within the current switches is high, thereby ensuring high speed operation.

Match or no-Match situations are detected accurately by large voltage swings on the bit-sense (Search) lines without disturbing the contents of the storage devices, because the storage nodes are isolated from the Search circuitry.

Another useful feature of our invention is that the same circuitry is used both for Writing as well as for Searching.

BRIEF DESCRIPTION OF THE DRAWINGS

FIG. 3 is a table of typical voltages occurring at various denoted locations within the memory cell of FIG. 1.

FIG. 4 is a table of typical voltages and the states of the important components of the memory cell during the Search Mode.

DESCRIPTION OF THE PREFERRED EMBODIMENT

Figures 1, 2A, 2B:
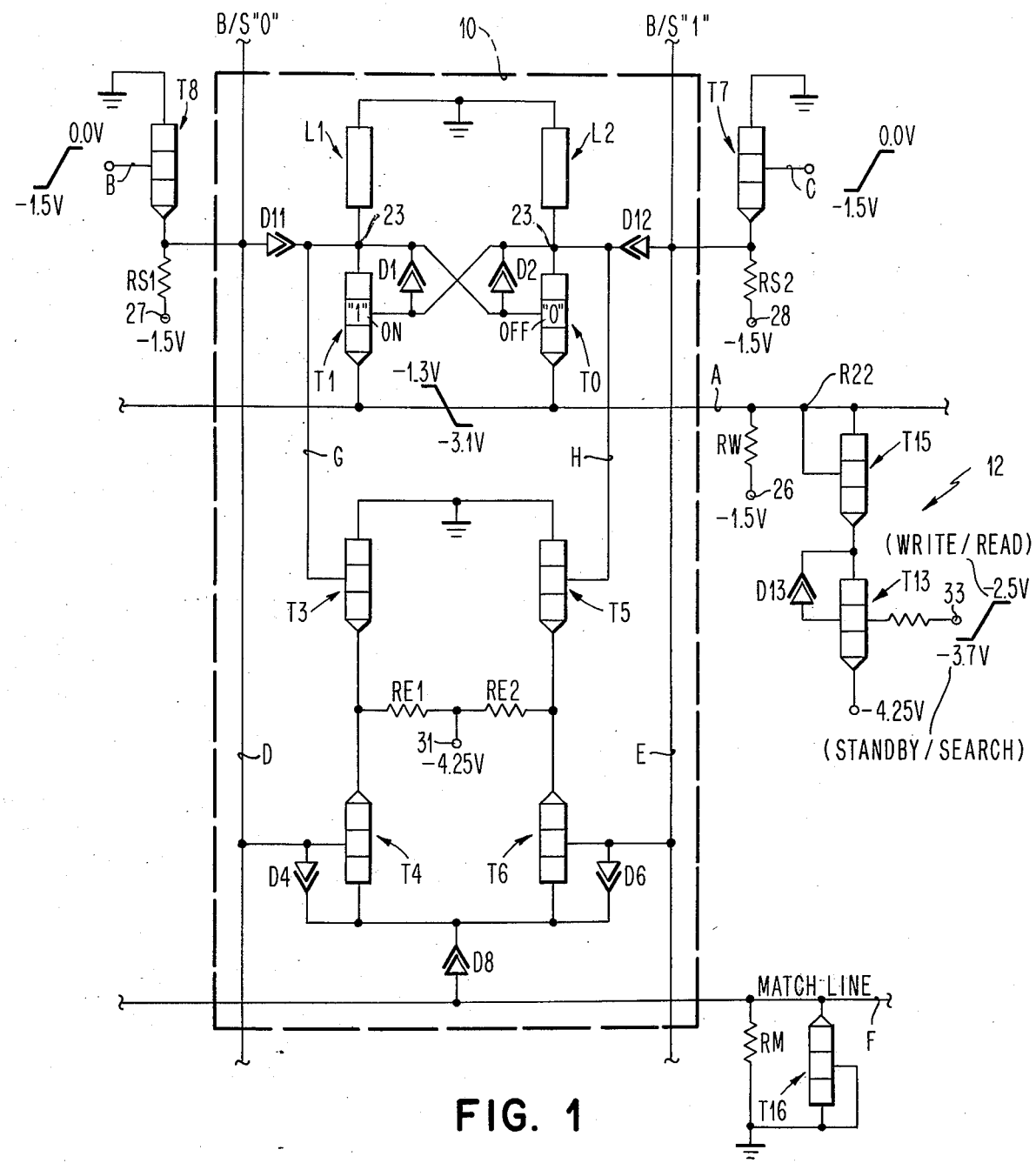
FIG. 1 is a schematic diagram of the preferred embodiment of the content-addressable memory cell of the present invention.
FIGS. 2A and 2B are more detailed diagrams of components illustrated in FIG. 1.

Turning now to FIG. 1, the memory cell of the invention is illustrated within the dashed lines denoted by the numeral 10. The storage elements comprise bipolar transistors T0 and T1 which are connected in the standard cross-coupled fashion at their respective bases and collectors. Schottky diodes D1 and D2, which are connected between the base and collector of transistors T1 and T0, respectively, function in the usual manner as anti-saturation devices to enhance the cell's switching speed by reducing minority carrier storage in the base regions. The superiority of Schottky barrier diodes over conventional diodes is well known to semiconductor designers. However, it is obvious that other types of low barrier diodes will also perform suitably.

The Word line of the cell, which is common to numerous cells along the same row in the memory array, is denoted as line A and is connected to the emitters of transistors T0 and T1. The driving potential on the Word line is generated by word driver 12, which comprises transistor T13, anti-saturation diode D13, transistor T15 connected as a diode, and a potential at terminal 26 connected to line A through resistor RW.

Each collector of the cross-coupled transistors is also associated with a pair of transistors which function as current switches. Thus, transistors T3 and T4 and resistor RE1 form a current switch which is associated with storage transistor T1; and transistors T5 and T6 and resistor RE2 comprise a current switch which is associated with storage transistor T0. The outputs of the pair of current switches, i.e., the collectors of transistors T4 and T6 are DOT OR'ed to Match line F through Schottky diode D8 which isolates these outputs from the Match line. D8 functions to reduce parasitic capacitance in the Match line.

A clamping diode, denoted as T16, is connected from line F to ground across RM for insuring that the Match line does not undergo very negative transitions. This diode prevents Match Line F from discharging to too low a potential, which might occur if there were multiple mismatches along the Match line during a Search operation.

Both the Write as well as the Search functions in the cell are initiated by means of signals on inputs B and C at the bases of transistors T8 and T7, respctively. These have emitter-follower outputs connected to the bit-sense lines B/S "0" and B/S "1" which, for convenience, are denoted as lines D and E, respectively. During Standby, lines D and E are held at −1.5V by means of potentials at terminals 27 and 28, through resistors RS1 and RS2, respectively.

The collectors of storage transistors T1 and T0 are isolated from th bit-sense lines by diodes D11 and D12, respectively. Although such diodes have been used in the prior art to isolate the storage transistors from the bit-sense lines, they perform an important and novel function in our circuit as an isolation means during the Search mode of operation. This will be described in greater detail in the succeeding section of the specification. Briefly, e.g., during the Search "0", Stored "1" mode the small forward voltage drop across one of the diodes, e.g., D11, prevents the transmission of significant current from transistor T8 to affect transistor T1, but still enables the bases of transistors T3/T4 to switch. The other diode, D12, is reverse-biased and does the same with respect to transistors T7 and T0.

FIGS. 2A and 2B illustrate alternate embodiments of impedances L1 and L2 of FIG. 1. The impedances may either be resistors of appropriate value, say 10K ohms, as shown in FIG. 2A, or PNP transistors connected to the collectors of the storage transistors as constant current sources as in FIG. 2B. Both circuits are quite common as load elements for memory cells and form no part of our invention.

OPERATION

The operation of our novel cell will best be appreciated by referring to FIGS. 3 and 4 in conjunction with the diagram of the cell illustrated in FIG. 1. To assure a clear understanding, the operation will be described in terms of the four basic Modes: Standby, Read, Write and Search. Moreover, the operation is described in terms of specific potential levels and resistances which are a matter of design choice and in no way limit the scope of our invention.

In the Standby state, i.e., when the cell is unselected, word driver 12 is inoperative, with the base of transistor T13 held at −3.7V (volts). As indicated in row 1 of FIG. 3, the potential on word line A is around −1.3V, depending on the value of resistor RW and the potential (illustrated as −1.5V) at terminal 26. RW is preferably around 1.2K ohms. Transistors T7 and T8 are biased "off" by a potential of −1.5V on Search/Write inputs B and C which are connected to the bases of transistors T8 and T7, respectively. With these transistors held "off", the potentials on bit/sense lines D and E are held at around −1.5V by the potential sources at terminals 27 and 28 through resistors RS1 and RS2 which are around 500 ohms.

Diodes D11 and D12 are reverse-biased. One of the storage transistors T0 or T1 is conducting current. Following the conventional terminology in flip-flop cells, conduction in the "0" transistor, T0, would indicate that a bit "0" were stored in the cell. Similarly, conduction in the "1" transistor indicates a bit "1". In FIG. 1, T1 is "on", thereby indicating that a bit "1" is stored in the cell.

The potentials at the collectors of T1 and T0, and therefore on lines G and H, respectively, are established by the $V_{BE}$ of the storage transistors, the diode drop, VD, of the anti-saturation diodes and the Word line potential, VA.

With T1 conducting the potential, VG, at line G is:
1. $VG = VA + V_{BE}(T1) - VD1 = -1.1V,$ (1)

assuming that VA is −1.3V, $V_{BE}$ is 0.8V and VD1 is 0.6V.
The potential at line H is:
2. $VH = VA + V_{BE}(T1) = -0.5V$ (2)

These potentials assume more importance during the Search mode, which will be described in a succeeding section of the specification.

With regard to each current switch pair T3-T4 and T5-T6, only one of the transistors of each pair can be "on" at any instant. With one transistor of the pair rendered conductive by a base drive signal, the base-emitter junction of the other transistor is insufficiently foward-biased to conduct.

Applying these conditions, which are well known to circuit designers, to the current switch pair: the potential at the bases of T4 and T6 is substantially −1.5V on lines D and E; whereas the potential at the bases of T3 and T5 is established by devices T1 and T0 at −1.1V and −.5V, respectively. Because the bases of T3 and T5 are more positive than those of T4 and T6, the former transistors are "on" and the latter are "off", and the potential at Match line F is substantially OV.

Referring now to row 2 of FIG. 3, during the Read period both T7 and T8 remain "off" by virtue of −1.5V at their bases. Thus, bit/sense lines D and E remain at their initial biases of −1.5V from the potential source at terminals 27 and 28. To perform a Read operation, terminal 33 at the base of T13 is raised to −2.5V, whereby Word line A is brought down to −3.1V. With this reduced potential at the emitters of T1 and T0, one of the diodes D11 and D12 which is connected to the conducting transistor will conduct, drawing current from one of the bit-sense lines. In the present example, conduction of current through T1 would indicate that a "1" bit is stored in the cell, while current through T0 would indicate that a "0" bit is stored in the cell. Assuming that a "1" bit were stored in cell 10, as in FI. 1, D11 conducts and lowers the potential on bit-sense line D from −1.5V to −2.3V. The conduction of current through T1, due to the cross-coupling, clamps transistor T0 "off". Therefore, bit-sense line E remains at −1.5V. This difference in potential is sensed in a conventional manner as a bit "1" by a balanced detector (not shown) at the terminus of the bit-sense lines.

Reference to row 3 of FIG. 3 shows that the Read operation of a cell storing a bit "0" is similar except that the signals on lines D and E are reversed.

For a Write operation, the potential at Word line A is again lowered. In addition, the potential at the bases of either transistors T7 or T8 is raised, depending on whether a bit "1" or a bit "0" is to be stored in the cell so that current flows through only one of the transistors T0 or T1. This raises the potential to around −0.8V at one of the bit-sense lines, forcing the cell to the desired state through either D11 or D12. For example, referring to row 5 of FIG. 3, to write a "0" bit into the cell the potential at line B is raised to 0 from −1.5 volts, thereby causing T8 to turn "on". The potential on Line D rises from −1.5V to −0.8V. Current through T8 and D11 causes T0 to turn "on". Current through T0 causes T1 to be turned "off".

Transistors T7 and T8 are also used to initiate the Search operation in our novel cell. This dual function represents a significant advantage over many previous types of CAM cells, which require separate sets of devices for Writing and Searching.

It is also during the Search mode that the advantages of the current switch pair T3/T4 and T5/T6 come into play. The switching speed of the current switch pair provides a fast search. In addition, the characteristics of the current switch pair provide a large voltage swing on Match line F for accurate detection; conversely, only a small differential swing at their inputs causes them to switch.

Diodes D11 and D12 serve to isolate the bit-sense lines D and E for transistors T1 and T0. The differences in potential between lines D and G and lines E and H are never high enough to cause D11 and D12 to become conductive during the Search mode. However, the potential differences are enough to cause T3/T4 and T5/T6 to switch when appropriate.

As shown in rows 6 and 7 of FIG. 3 during the Search Mode, line A is at −1.3 volts and the potentials of lines B or C are raised to 0 volts depending on whether a search is being made for a data bit "0" or "1", respectively. This turns "on" one of the transistors T7 or T8 and causes the potential on its associated bit-sense line to rise from −1.5V to −0.8V. At this point bit-sense lines D and E are functioning as Search lines.

The remainder of the Search operation, detailing the operaton of the current switch pair, is best considered with reference to FIG. 4. If a bit "1" is stored in the cross-coupled transistors, a potential of −1.1V is at the base of T3 on line G; and a potential or −0.5V is at the base of T5 on line H, irrespective of whether the search is for a bit "0" or bit "1". This has been explained in the previous discussion of the Standby mode, in particular, equations (1) and (2).

Conversely, if a bit "0" were stored in the cell, with T0 conductive, a potential of −0.5V is at line G and a potential of −1.1V at line H.

Let us take as an example a search for a bit "0" when a bit "1" is stored in the cell. Referring to the last row of FIG. 3 and the first row of FIG. 4: Search line D is raised to −0.8V to initiate the Search. Because T1 is conductive (bit "1" stored), the potential or switch line G at the base of T3 is −1.1V; and the potential or switch line H at the base of T5 is −0.5V. The base of T4 at Search Line D becomes −0.8V while the base of T6 at Search Line E remain at −1.5V. Because the potential at T4 is higher than that at T3, T4 turns "on" and T3 turns "off". However, the potential at T5 remains higher than that of T6, therefore, T5 remains "on" and T6 remains "off".

Current flows from ground through RM, D8, T4 and RE1 to the −4.25V at terminal 31. With RM and RE1 having values of 1.2K ohms and 2.0K ohms, respectively, the potential at Match Line F falls from OV to −0.8V. This is indicative of a Mismatch.

It will be noted that diodes D11 and D12 remain "off" throughout this period, thereby isolating transistors T1 and T0 from the potential swings at Lines D and E. The maximum forward voltage across either of these diodes during the Search mode is 0.3V. This occurs when a Search (bit-sense) line is lowered to −0.8V and the corresponding switch line is at −1.1V, i.e., under Mismatch conditions. Because the diodes require a 0.6V forward voltage to conduct, they are always "off". On the other hand, the 0.3V potential difference is enough to cause the appropriate current switch transistor pair to switch.

Basically, then, the pair of current switches function to compare the data stored in the storage transistors with the Search data presented to the bit-sense lines by the cell-addressing transistors T7 and T8.

Taking as another example a situation where the search data matches the stored data, e.g., Stored "1", Search "1", then line E is raised to −.8V. The potential on switch line G is again at −1.1V and line H is at −0.5V. In this case, both T3 and T5 remain conductive because their base potentials are higher than the base potentials of T4 and T6. Match Line F therefore remains at OV, indicative of a Match.

In summary, we have invented a content-addressable memory which utilizes current switching for searching at high speeds. Large potential swings are available on the seach lines to provide accurate detection of mismatches while the storage nodes are isolated therefrom. In addition, the Write circuitry performs the dual function of Searching during the Search mode.

While the invention has been particularly shown and described with preference to a preferred embodiment thereof, it will be understood by those skilled in the art that there are changes in form and detail which may be made therein, without departing from the spirit and scope of the invention. For example, the conductivity type of the transistors uused in the circuit could be reversed with the appropriate changes in the biasing arrangement. The characteristics of the transistors, diodes and other components could be altered as desired to change the various signal levels throughout the cell.

We claim:

1. A content-addressable memory comprising:
    a bistable memory cell having flip-flop characteristics including first and second storage elements having input/output terminals;
    means for connecting first and second Search lines with said first and second input/output terminals, respectively;
    a Match line:
    first and second current switch means associated with said first and second storage elements, respectively, each current switch including: first and second transistors, the emitters of which are connected in common, the base of said first transistor connected to said storage element input/output terminal, the base of said second transistor connected to said Search line, and the collector of said second transistor connected to said Match line;
    whereby said Match line receives an indication of a match or mismatch when a search bit is compared with a data bit stored in said bistable cell.

2. A content-addressable memory cell as in claim 1 wherein said connecting means comprise diodes connected in a direction to prevent the flow of current from said Search line to said storage transistors during a Search operation.

3. A cell as in claim 2 wherein said diodes are Schottky Barrier diodes.

4. A content-addressable memory cell as in claim 1 and further comprising:
    first and second transistors connected in the emitter-follower mode to said Search line for applying either a Search or a Write signal to said memory cell during the Search or Write modes of operation, respectively.

5. A content-addressable memory cell as in claim 1 and further comprising:

isolation means connected between said current switch transistors and said Match line for reducing parasitic capacitance in said Match line.

6. A content-addressable memory cell as in claim 1 and further comprising:
means for preventing said Match line from undergoing excessive transitions when multiple mismatches occur along said Match line.

7. A content-addressable memory cell comprising:
a bistable memory cell including first and second cross-coupled storage transistors;
A Word line, connected to the emitters of said transistors, to which a predetermined potential is applied when said cell is selected for a Write or Read mode of operation;
a Match line;
means for interrogating said cell during a Search mode of operation and for writing data into said cell during a Write mode of operation;
first and second isolation means, connected between said interrogation/writing means and the collector of said first and second transistors, respectively, for isolating said transistor from potentials generated by said interrogation/writing means during the Search mode of operation;
first and second current switch means associated with said first and second transistors, respectively;
each current switch means including first and second transistors, the emitters of which are connected in common, the base of said first transistor connected to the collector terminal of its associated storage element, the base of said second transistor connected to said interrogation/writing means, and the collector of said second transistor connected to said Match line;
whereby said current switch means generate, on said Match line, signals indicative of a match or mismatch between an interrogating data bit generated by said interrogation/writing means and a data bit stored in said memory cell.

8. A content-addressable memory cell as in claim 7 wherein said isolation means are Schottky Barrier diodes.

9. A content-addressable memory cell as in claim 7 wherein said interrogating/writing means comprise:
first and second emitter-follower transistors;
said first transistor connected to said first isolation means and the second input terminal of said first current means;
said second transistor connected to said second isolation means and the second input terminal of said second current switch means.

10. A content-addressable memory cell as in claim 7 and further comprising:
isolation means connected between said current switch transistors and said Match line for reducing parasitic capacitance in said match line.

11. A content-addressable memory cell as in claim 7 and further comprising:
means for preventing said Match line from undergoing excessive transitions when multiple mismatches occur along said Match line.

12. A content-addressable memory comprising:
a bistable memory cell having flip-flop characteristics including first and second storage elements having input/output terminals;
means for connecting first and second Search lines with said first and second input/output terminals, respectively;
first and second transistors connected in the emitter-follower mode to said Search line for applying either a Search or a Write signal to said memory cell during the Search or Write modes of operation, respectively;
a Match line;
first and second current switch means associated with said first and second storage elements, respectively, each current switch including a first input terminal connected to said storage element input/output terminal, a second input terminal connected to said Search line, and an output terminal connected to said Match line;
whereby said Match line receives an indication of a match or mismatch when a search bit is compared with a data bit stored in said bistable cell.

13. A content-addressable memory cell as in claim 12 wherein said connecting means comprise diodes connected in a direction to prevent the flow of current from said Search line to said storage transistors during a Search operation.

14. A cell as in claim 13 wherein said diodes are Schottky Barrier diodes.

15. A content-addressable memory comprising:
a bistable memory cell having flip-flop characteristics including first and second storage elements having input/output terminals;
means for connecting first and second Search lines with said first and second input/output terminals, respectively;
a Match line;
first and second current switch means associated with said first and second storage elements, respectively, each current switch including a first input terminal connected to said storage element input/output terminal, a second input terminal connected to said Search line, and an output terminal connected to said Match line;
whereby said Match line receives an indication of a match or mismatch when a search bit is compared with a data bit stored in said bistable cell; and
means for preventing said Match line from undergoing excessive transitions when multiple mismatches occur along said Match line.

16. A content-addressable memory cell comprising:
a bistable memory cell including first and second cross-coupled storage transistors;
a Word line, connected to the emitters of said transistors, to which a predetermined potential is applied when said cell is selected for a Write or Read mode of operation;
a Match line;
means for interrogating said cell during a Search mode of operation and for writing data into said cell during a Write mode of operation including:
first and second emitter-follower transistors;
said first transistor connected to said first isolation means and the second input terminal of said first current switch means;
said second transistor connected to said second isolation means and the second input terminal of said second current switch means;
first and second isolation means, connected between said interrogation/writing means and the collector of said first and second transistors, respectively, for isolating said transistor from potentials generated by said interrogation/writing means during the Search mode of operation;

first and second current switch means associated with said first and second transistors, respectively;

each said current switch means having a first input terminal connected to the collector terminal of its associated storage element, a second input terminal connected to said interrogation/writing means, and an output terminal connected to said Match line;

whereby said current switch means generate, on said Match line, signals indicative of a match or mismatch between an interrogating data bit generator by said interrogation/writing means and a data bit stored in said memory cell.

17. A content-addressable memory cell as in claim 16 wherein said isolation means are Schottky Barrier diodes.

18. A content-addressable memory cell comprising:
a bistable memory cell including first and second crosscoupled storage transistors;
a Word line, connected to the emitters of said transistors, to which a predetermed potential is applied when said cell is selected for a Write or Read mode of operation;
a Match line;

means for interrogating said cell during a Search mode of operation and for writing data into said cell during Write mode of operation;

first and second isolation means, connected between said interrogation/writing means and the collector of said first and second transistors, respectively, for isolating said transistor from potentials generated by said interrogation/writing means during the Search mode of operation;

first and second current switch means associated with said first and second transistors, respectively;

each said current switch means having a first input terminal connected to the collector terminal of its associated storage element, a second input terminal connected to said interrogation/writing means, and an output terminal connected to said Match line;

whereby said current switch means generate, on said Match line, signals indicative of a match or mismatch between an interrogating data bit generator by said interrogation/writing means and a data bit stored in said memory cell; and means for preventing said Match line from undergoing excessive transitions when multiple mismatches occur along said Match line.

* * * * *